United States Patent
Singh et al.

(10) Patent No.: US 12,028,058 B2
(45) Date of Patent: Jul. 2, 2024

(54) SELF-BIASING SHUNT SWITCH WITH BOOTSTRAPPING

(71) Applicant: Samsung Electronics Co., Ltd.

(72) Inventors: Amitoj Singh, Sunnyvale, CA (US); Tienyu Chang, Sunnyvale, CA (US); Siu-Chuang Ivan Lu, San Jose, CA (US)

(73) Assignee: Samsung Electronics Co., Ltd., Yongin-si (KR)

( * ) Notice: Subject to any disclaimer, the term of this patent is extended or adjusted under 35 U.S.C. 154(b) by 0 days.

(21) Appl. No.: 18/301,184

(22) Filed: Apr. 14, 2023

(65) Prior Publication Data
US 2023/0261651 A1 Aug. 17, 2023

Related U.S. Application Data

(63) Continuation of application No. 16/987,335, filed on Aug. 6, 2020, now Pat. No. 11,641,202.

(60) Provisional application No. 63/036,331, filed on Jun. 8, 2020.

(51) Int. Cl.
*H03K 17/56* (2006.01)
*H03F 3/24* (2006.01)
*H04B 1/04* (2006.01)

(52) U.S. Cl.
CPC ............ *H03K 17/56* (2013.01); *H03F 3/245* (2013.01); *H04B 1/04* (2013.01); *H03F 2200/451* (2013.01); *H03K 2217/0036* (2013.01)

(58) Field of Classification Search
CPC ............ G05F 1/613; G05F 1/618; G05F 3/08; H02M 3/158; H02M 3/335; H03F 3/24; H03F 3/189; H03F 3/245; H03K 3/00; H03K 3/01; H03K 17/00; H03K 17/16; H03K 17/56; H03K 17/687; H04B 1/00; H04B 1/04; H04B 1/40; H04B 1/44; H04B 1/3805
USPC ................. 323/224, 272, 283, 311; 330/295; 455/83
See application file for complete search history.

(56) References Cited

U.S. PATENT DOCUMENTS

| | | | |
|---|---|---|---|
| 9,620,424 | B2 | 4/2017 | Blin et al. |
| 9,712,158 | B1 | 7/2017 | Cavus et al. |
| 9,948,281 | B2 | 4/2018 | Ranta |
| 10,523,195 | B1 | 12/2019 | Luo et al. |
| 10,574,286 | B2 | 2/2020 | Wang et al. |
| 2006/0252394 | A1 | 11/2006 | Suwa et al. |
| 2009/0029654 | A1 | 1/2009 | Fu et al. |
| 2015/0318852 | A1* | 11/2015 | Hoogzaad ............ H03K 17/687 327/434 |
| 2019/0173481 | A1 | 6/2019 | Ali et al. |
| 2019/0199347 | A1 | 6/2019 | Joo et al. |
| 2019/0372556 | A1 | 12/2019 | Tripathi |

(Continued)

*Primary Examiner* — Shawkat M Ali
(74) *Attorney, Agent, or Firm* — Lewis Roca Rothgerber Christie LLP

(57) ABSTRACT

A shunt switch. In some embodiments, the shunt switch includes a transistor stack including a first transistor and a capacitor. The transistor stack may have a first end terminal and a second end terminal, the first transistor being connected to the first end terminal, the first end terminal being connected to a switching terminal of the shunt switch. The (Continued)

capacitor may have a first terminal connected to the second end terminal of the transistor stack, and a second terminal connected to a low-impedance node.

20 Claims, 18 Drawing Sheets

(56) References Cited

U.S. PATENT DOCUMENTS

2020/0021316 A1  1/2020  Ma et al.

* cited by examiner

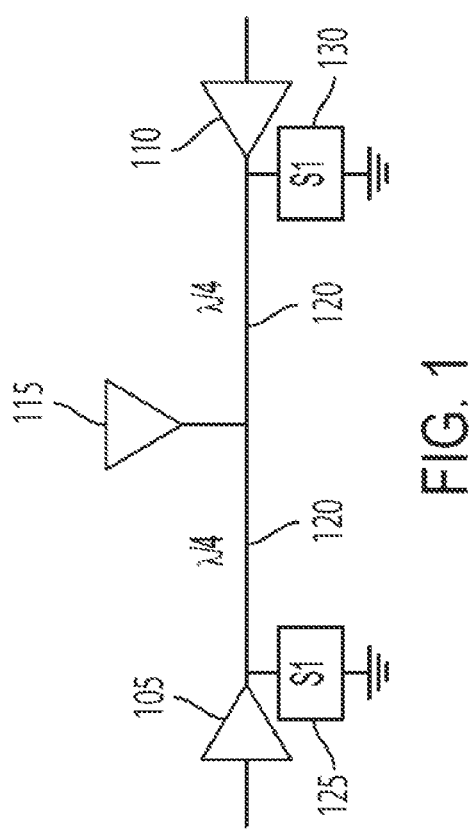

SELF-BIASING SHUNT SWITCH WITH BOOTSTRAPPING

CROSS-REFERENCE TO RELATED APPLICATION(S)

The present application is a continuation of U.S. patent application Ser. No. 16/987,335, filed Aug. 6, 2020, which claims priority to and the benefit of U.S. Provisional Application No. 63/036,331, filed Jun. 8, 2020, entitled "A SELF-BIASING TX/RX SHUNT SWITCH WITH BOOTSTRAPPING FOR HIGH LINEARITY FOR 5G/MM-WAVE APPLICATIONS", the entire content of all of which is incorporated herein by reference.

FIELD

One or more aspects of embodiments according to the present disclosure relate to radio frequency, microwave, and mm-wave circuits, and more particularly to a shunt switch for a radio frequency, microwave, or mm-wave circuit.

BACKGROUND

Shunt switches may be constructed of multiple transistors connected in series, with a larger number of transistors generally improving the linearity of the switch but degrading the on-state resistance of the switch, and a smaller number of transistors generally improving on-state resistance of the switch but degrading the linearity of the switch.

Thus, there is a need for an improved shunt switch.

SUMMARY

According to some embodiments of the present disclosure, there is provided a shunt switch, including: a transistor stack including a first transistor; and a capacitor, the transistor stack having a first end terminal and a second end terminal, the first transistor being connected to the first end terminal, the first end terminal being connected to a switching terminal of the shunt switch, the capacitor having a first terminal connected to the second end terminal of the transistor stack, and a second terminal connected to a low-impedance node.

In some embodiments, the shunt switch further includes a bootstrapping transistor connected across the first end terminal and a gate of the first transistor.

In some embodiments, the transistor stack further includes a second transistor connected in series with the first transistor.

In some embodiments, the transistor stack further includes a bootstrapping transistor connected across the first end terminal and a gate of the first transistor.

In some embodiments, the transistor stack further includes a bias circuit connected to a gate of the first transistor.

In some embodiments, the transistor stack further includes a bootstrapping transistor connected across the first end terminal and a gate of the first transistor.

In some embodiments, the bias circuit is further connected to a gate of the bootstrapping transistor.

In some embodiments, the transistor stack further includes a second transistor, wherein: the first transistor is a field effect transistor of a first channel type, the second transistor is a field effect transistor of the first channel type, and the first transistor is connected in series with the second transistor.

In some embodiments, the transistor stack further includes a bias circuit connected: to a gate of the first transistor, and to a gate of the second transistor.

In some embodiments, the bias circuit includes a first bias source connected: through a first resistor to the gate of the first transistor, and through a second resistor to the gate of the second transistor.

In some embodiments, the bias circuit is further connected to a source of the first transistor.

In some embodiments, the bias circuit is further connected to a source of the second transistor.

In some embodiments, the bias circuit further includes a second bias source connected: through a third resistor to the source of the first transistor; and through a fourth resistor to the source of the second transistor.

In some embodiments, the transistor stack further includes a bootstrapping transistor connected across the first end terminal and a gate of the first transistor.

In some embodiments: the first transistor is an n-channel field effect transistor, the second transistor is an n-channel field effect transistor, and the bootstrapping transistor is an n-channel field effect transistor.

In some embodiments, the transistor stack further includes a bias circuit including: a first bias source connected: through a first resistor to a gate of the first transistor, and through a second resistor to a gate of the second transistor; a second bias source connected: through a third resistor to a source of the first transistor; and through a fourth resistor to a source of the second transistor; and a third bias source connected through a fifth resistor to a gate of the bootstrapping transistor.

In some embodiments: in an on state of the shunt switch: the first bias source supplies a first voltage; the second bias source supplies a second voltage, and the third bias source supplies the second voltage; and in an off state of the shunt switch: the first bias source supplies the second voltage; the second bias source supplies the first voltage, and the third bias source supplies the first voltage, the second voltage being greater than the first voltage.

According to some embodiments of the present disclosure, there is provided a transmitter, including: a first power amplifier having an output connected to a common node through a first transmission line; and a first shunt switch.

In some embodiments, the transmitter further includes: a second power amplifier having an output connected to the common node through a second transmission line; and a second shunt switch, having a switching terminal connected to the output of the second power amplifier.

According to some embodiments of the present disclosure, there is provided a shunt switch having a switched terminal and including: a transistor stack including a first transistor, the transistor stack being connected to: the switched terminal and a low-impedance node; the shunt switch being configured to self-bias: to an on state, when a signal power at the switched terminal is less than a first threshold, and to an off state, when a signal power at the switched terminal is greater than a second threshold, the second threshold being greater than the first threshold.

BRIEF DESCRIPTION OF THE DRAWINGS

These and other features and advantages of the present disclosure will be appreciated and understood with reference to the specification, claims, and appended drawings wherein:

FIG. 1 is a block diagram of a transmitter, according to an embodiment of the present disclosure;

DETAILED DESCRIPTION

Figure 2A:
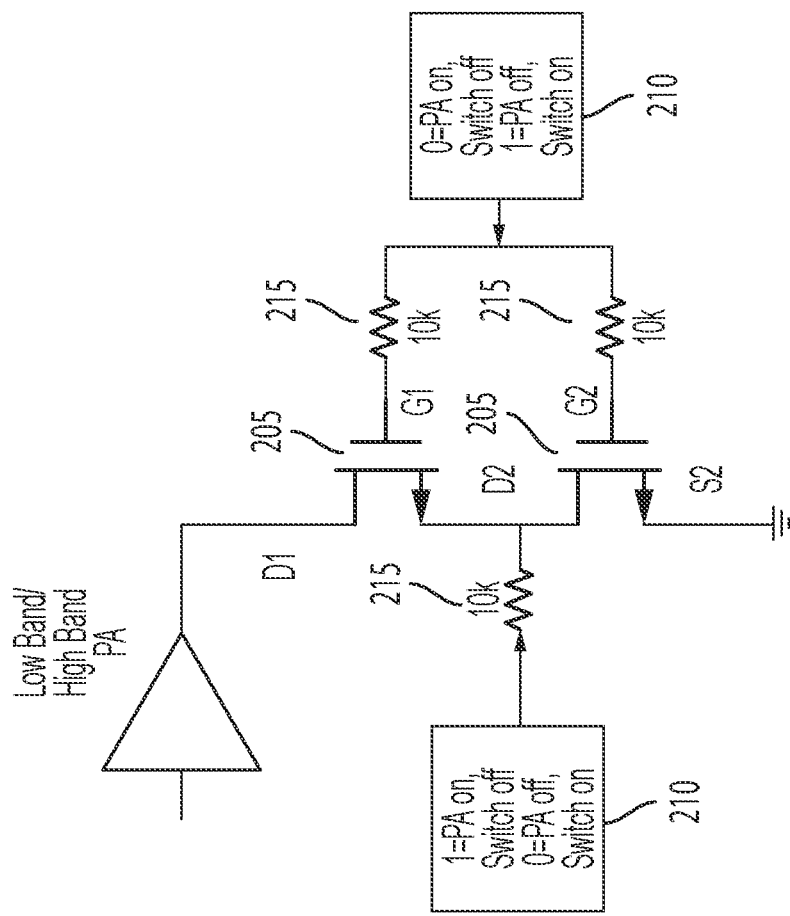
FIG. 2A is a schematic diagram of a shunt switch, according to an embodiment of the present disclosure.

The detailed description set forth below in connection with the appended drawings is intended as a description of exemplary embodiments of a self-biasing shunt switch with bootstrapping provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

FIG. 1 is a simplified block diagram of a transmitter, in some embodiments. Each of a first amplifier 105 and a second amplifier 110 is connected to an antenna 115 via a respective quarter-wave transmission line 120. A first shunt switch 125 is connected between the output of the first amplifier 105 (e.g., a power amplifier (PA)) and a low-impedance node (e.g., ground), and a second shunt switch 130 is connected between the output of the second amplifier 105 and a low-impedance node. The system may be configured such that one amplifier operates at a time; when the first amplifier is operating (e.g., driving a radio frequency, microwave, or mm-wave) signal to the antenna, the second shunt switch is closed, resulting in a short (or near short) to ground at the output of the second amplifier and an open circuit (or a nearly open circuit) at the end, near the antenna, of the corresponding quarter-wave transmission line 120. In some embodiments, the low-impedance node may be at a DC voltage other than ground, and it may be a low-impedance node (e.g., as a result of having connected to it a quarter-wave open stub). As used herein, a "low-impedance node" is a circuit node that has an impedance to ground, at radio frequency, microwave, or mm-wave frequencies, having a magnitude significantly smaller than a characteristic impedance of the circuit, e.g., a magnitude of less than 5 ohms.

As such, the closing of the second shunt switch 130 makes it possible for the signal from the first amplifier to be transmitted with little loss to the antenna. The operation of the second amplifier 110 may be analogous, with the first shunt switch 125 being closed when the second amplifier is operating. In some embodiments the amplifiers may transmit in different frequency bands. Two amplifiers (each with a respective shunt switch) are shown in FIG. 1; in some embodiments more than two amplifiers, (each with a respective shunt switch) may be connected to the common node (at the antenna), each being connected to the common node through a respective quarter-wave transmission line 120. In such an embodiment each of the shunt switches may, in operation, be closed except when the amplifier to which it is connected is operating. In some embodiments a shunt switch as disclosed herein is used in other applications than that illustrated in FIG. 1, for example, in a compact circuit (e.g., on an integrated circuit chip), mimicking the behavior of a quarter-wave transmission line.

Figure 2B:
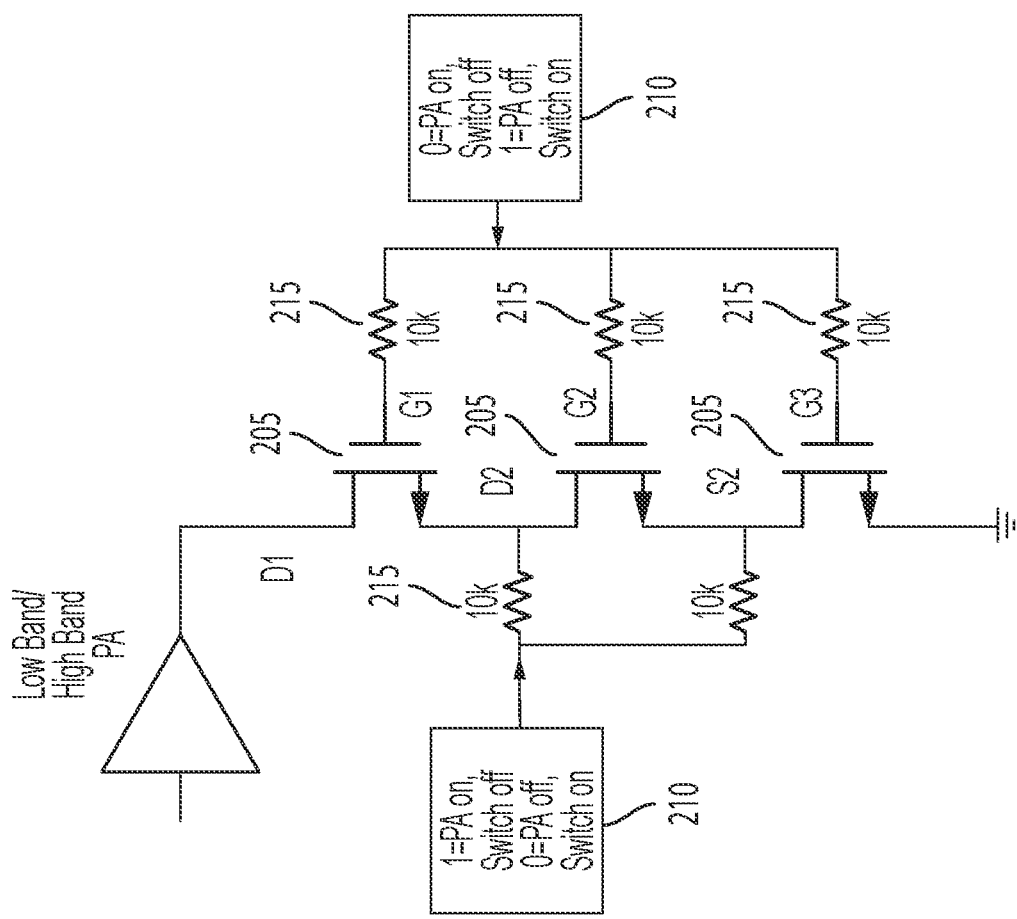
FIG. 2B is a schematic diagram of a shunt switch, according to an embodiment of the present disclosure.

FIGS. 2A and 2B show shunt switches, in some embodiments. Each of the switches includes a transistor stack including two (FIG. 2A) or three (FIG. 2B) transistors 205 connected in series. As used herein, when the connections of a transistor are described as though the transistor were a two-terminal device (e.g., two or more transistors connected "in series" or a transistor "connected across" a first node and a second node), the connections of the power terminals of the transistor (the ends of the channel of a field effect transistor, or the collector and emitter of a bipolar transistor) are being described. As used herein, a "transistor stack" is (i) one transistor, or (ii) a plurality of transistors, connected in series. The transistor stack may have a first end terminal (e.g., in FIG. 2A, the drain of the first (upper) transistor) and a second end terminal (e.g., in FIG. 2A, the source of the second (lower) transistor).

The shunt switch may include one or more bias sources 210 which may be drive circuits with a low output impedance, e.g., voltage sources. Each of the bias sources may be controllable (e.g., by a processing circuit, discussed in further detail below) so that (i) in the on state of the shunt switch (when the power amplifier is not operating), it supplies a first bias voltage (e.g., a voltage less than 0.1 V, represented by "0" in the drawings) and in the off state of the shunt switch (when the power amplifier is operating), it supplies a second bias voltage (e.g., a voltage greater than 1.1 V, represented by "1" in the drawings), or (ii) vice versa. Bias voltages may be applied by respective bias sources 210 through a plurality of biasing resistors 215 (e.g., 10 k ohm resistors). The number of transistors may be increased (e.g., three transistors may be used, as in FIG. 2B, instead of two, as in FIG. 2A) to improve the linearity of the switch at the expense of increased on-resistance, or the number of transistors may be decreased (e.g., two transistors may be used, as in FIG. 2A, instead of three, as in FIG. 2B) to reduce the on-resistance at the expense of a degradation in the linearity of the switch.

Figure 3A:
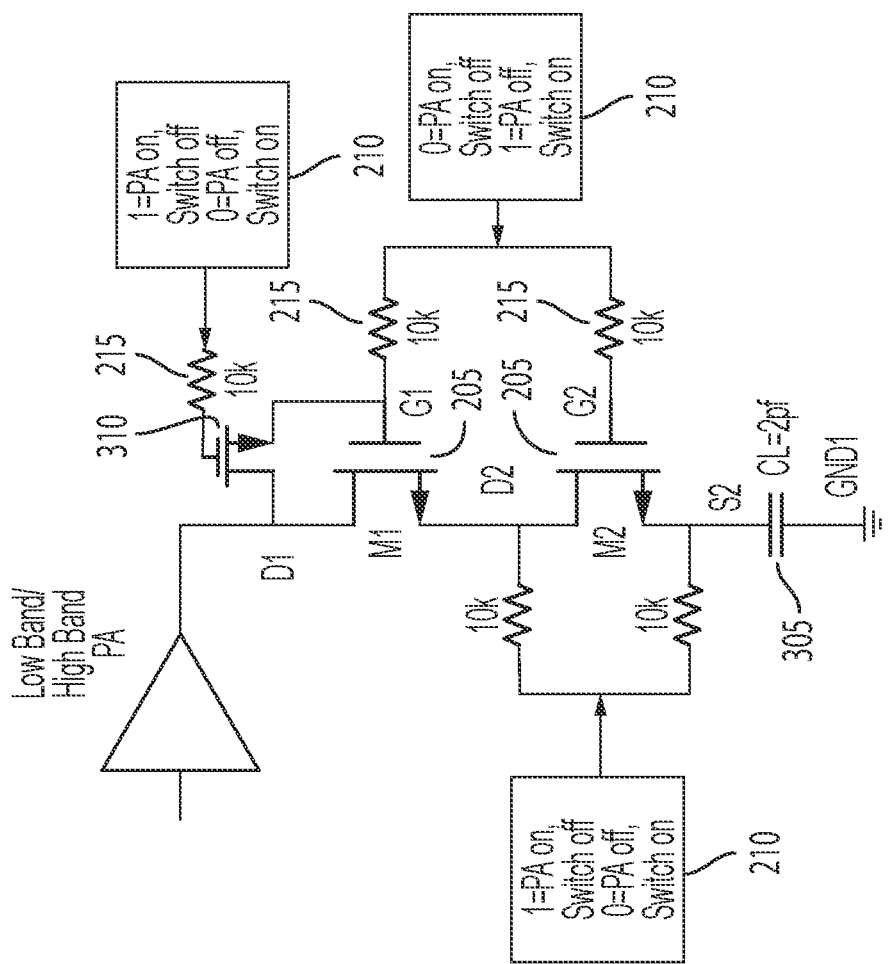
FIG. 3A is a schematic diagram of a shunt switch, according to an embodiment of the present disclosure.
Figure 3B:
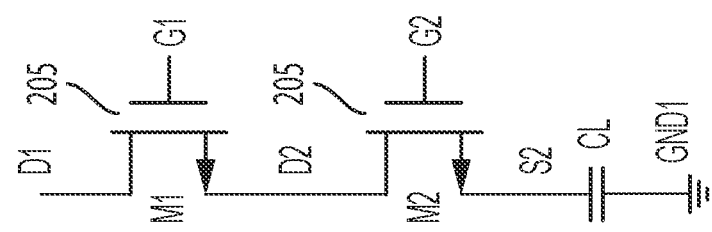
FIG. 3B is a simplified schematic diagram of a shunt switch, according to an embodiment of the present disclosure.

In some embodiments, a self-biasing shunt switch may be constructed, as shown in FIG. 3A, and as described in further detail below. Like the embodiment of FIG. 2A, the circuit includes a first (upper) transistor M1 and a second (lower) transistor M2, connected in series. The shunt switch has a "switching terminal", i.e., the terminal that may be connected to the output of a power amplifier as shown. The switching terminal is the first end terminal of the transistor stack, e.g., the drain of the first (upper) transistor M1, in the embodiment of FIG. 3A. The embodiment of FIG. 3A further includes a capacitor 305, a bootstrapping transistor 310, and a bias source 210 connected to the gate of the bootstrapping transistor 310 through a biasing resistor 215. The transistors 205 of the transistor stack may be field effect transistors of the same channel type, e.g., they may be n-channel field effect transistors, as shown. The self-biasing shunt switch structure (enabled by the capacitor 305, and assisted by the bootstrapping transistor 310, as discussed in further detail below), together with biases applied by the bias sources 210, leads the switch to transition to an on state when the power amplifier is not operating (e.g., producing an output power less than a first threshold) and to transition to the off state when the power amplifier is operating (e.g., producing an output power exceeding a second threshold).

In the embodiment of FIG. 3A, (as indicated by the labels, in FIG. 3A, on the bias sources 210) each of (i) the bias source 210 connected to the gate of the bootstrapping transistor 310 and (ii) the bias source connected to the source and to the drain of the second transistor M2 may be controlled to produce the first voltage when the shunt switch is in the on state (and the power amplifier is not operating) and to produce the second voltage when the shunt switch is in the off state (and the power amplifier is operating). The bias source 210 connected to the gate of the first transistor M1 and to the gate of the second transistor M2 may be controlled to produce the first voltage when the shunt switch is in the off state (and the power amplifier is operating) and to produce the second voltage when the shunt switch is in the on state (and the power amplifier is not operating). In some embodiments, instead of the two bias sources 210 shown in FIG. 3A respectively connected to (i) the source and the drain of the second transistor M2 and (ii) the gate of the bootstrapping transistor 310, a single bias source is connected to (i) the source of the second transistor M2, (ii) the drain of the second transistor M2, and (iii) the gate of the bootstrapping transistor 310, through three respective biasing resistors 215.

Such a self-biasing switch (e.g., a switch including the capacitor 305 and the bootstrapping transistor 310) may have better linearity and better on resistance than a traditional switch with multiple devices stacked which doesn't have a self-biasing capability (e.g., a switch as shown in FIG. 2A). The presence of the capacitor 305 may make it possible for the source of the bottom-most transistor in the transistor stack to be self-biased to a voltage different from the DC voltage of the low-impedance node (e.g., ground) (as discussed in further detail below).

The operation of the self-biasing switch may be understood as follows, in the context of FIGS. 3B to 3I. It may be observed in simulation that in the off state the various nodes in the circuit settle to a steady state DC voltage with or without the external biases being provided based on the signal level being generated by the transmitter, with some swing on top of it. The nodes of interest are S2, D2 and G2.

D1 is the output of the power amplifier (PA) which is shorted to G1 through the bootstrapping transistor. The bootstrapping transistor is omitted in the circuit of FIG. 3B, to simplify the analysis. The effect of the bootstrapping transistor is to ensure that the potentials at the nodes D1 and G1 are the same. This is taken into account in the explanations of FIGS. 3B to 3I herein. In the terminology used herein, node names are also used to refer to the potentials at the corresponding nodes, e.g., "S2" may refer to the node S2 or to the potential at the node S2.

To understand why the nodes of the circuit settle in a particular way, S2 is set to an initial value of −1 V in the simulation to exaggerate the movement of S2 from −1 V to its final voltage which is above 0.8 V. The following text explains the transient operation of the switch when it transitions to the off state, using transient waveforms at various time instants to illustrate the behavior of the switch.

A first phase, referred to herein as "phase 1" represents the start of the transition. The following terminology is used herein:

The "positive cycle" is the approximate time during which G1 remains above D2.

The "negative cycle" is the time during which G1<D2, turning the upper transistor off.

The "on state" of a transistor is any voltage for which it is at least approximately the case that Vgs>Vth or Vgd>Vth, where Vth is the threshold voltage of the transistor. This definition is used because the transistors are large in size and because in any transistor the transition between an on state and an off state is not perfectly abrupt; the on-resistance (Ron) continues to increase as Vgs is reduced.

The "off state" of the switch is a condition in which both Vgs<Vth and Vgd<Vth.

Figure 3C:
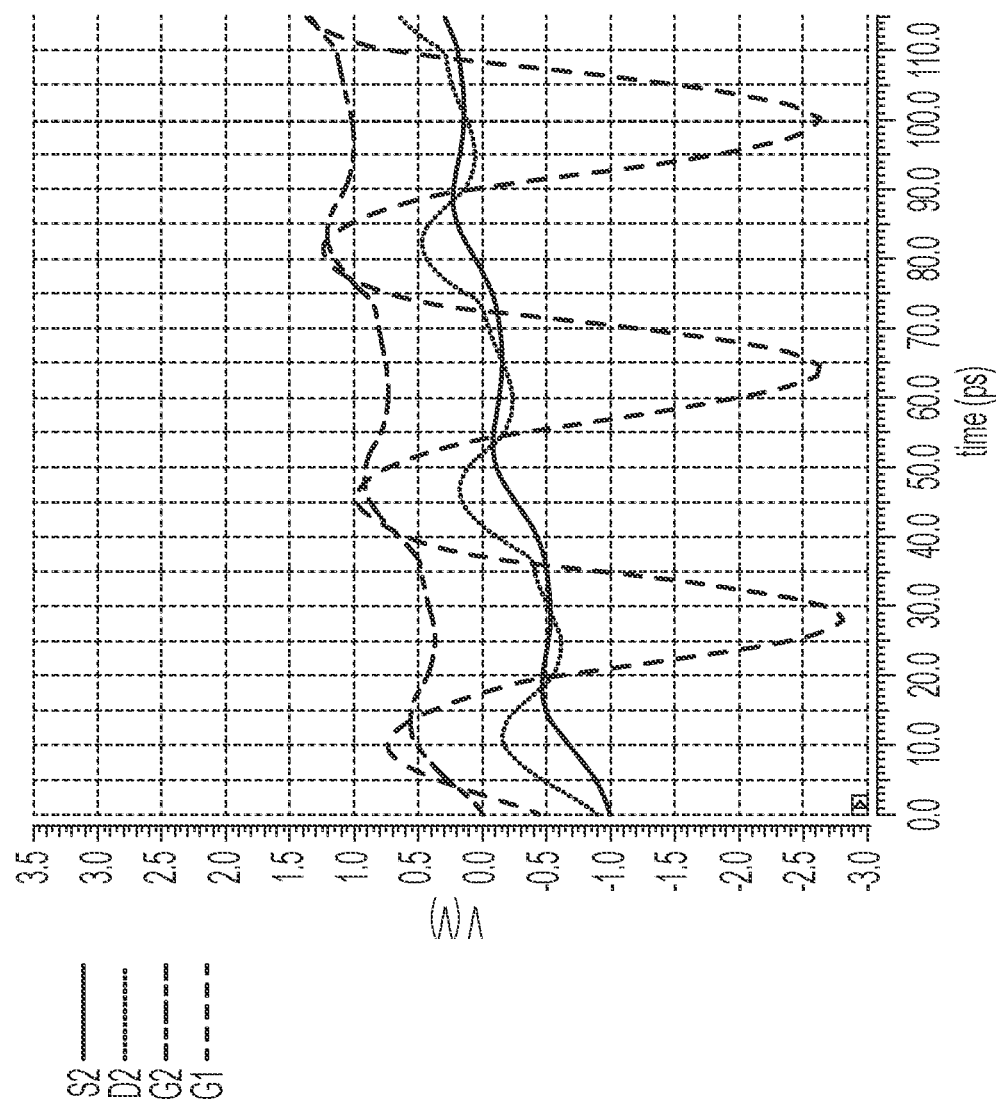
FIG. 3C is a graph of waveforms, according to an embodiment of the present disclosure.

The simulated waveforms of FIG. 3C show that, other than node S2 which, in the simulation, is initialized with an initial voltage, both D2 and G1 also have non-zero initial voltages. Both of the transistors are on at this time and hence there is a voltage division between the 50-ohm power amplifier port providing a 0 DC voltage to G1 and a −1 V initial voltage passing the initial condition through Ron.

In each positive cycle of phase 1, M1 and M2 turn on with a relatively high Vgs hence a small Ron. In the negative cycle the transistor M2 is still on while the transistor M1 turns off.

Figure 3D:
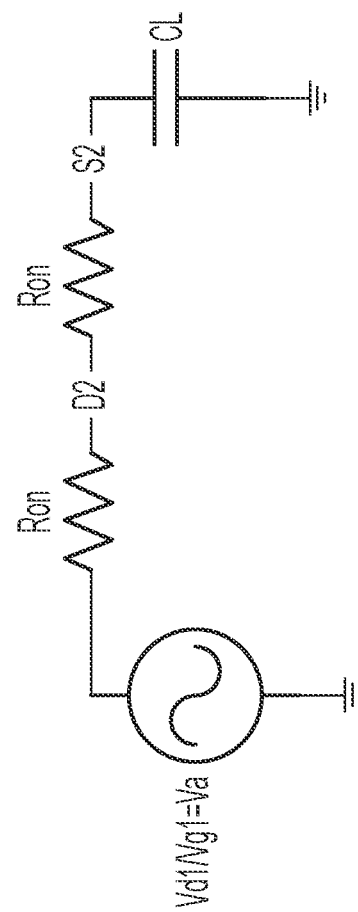
FIG. 3D is a diagram of a simplified equivalent circuit of a shunt switch, according to an embodiment of the present disclosure.
Figure 3E:
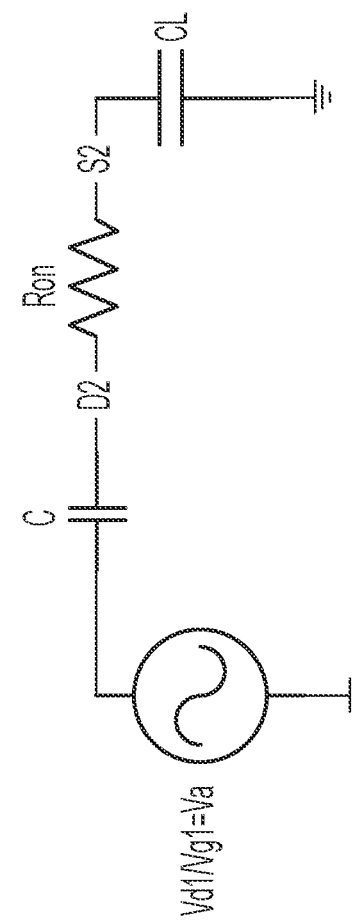
FIG. 3E is a diagram of a simplified equivalent circuit of a shunt switch, according to an embodiment of the present disclosure.

During each positive cycle of phase 1, the circuit behaves approximately as the circuit of FIG. 3D. Assuming Ron=10Ω, CL=2 pF, and Freq=28 GHz:

$$Vd2 = \frac{(1 + s*Ron*CL)*Va}{1 + s*2*Ron*CL}, |Vd2| \approx 0.515Va \quad 1$$

and $$Vs2 = \frac{1*Va}{1 + s*2*Ron*CL}, |Vs2| \approx 0.14Va \quad 2$$

where Va is the voltage at the output of the power amplifier. During each negative cycle of phase 1, the circuit behaves approximately as the circuit of FIG. 3E, with C=25 fF Then $$Vd2 = \frac{(C + s*Ron*CL*C)*Va}{C + CL + s*Ron*CL*C}, |Vd2| \approx 0.045Va \quad 3$$

and $$Vs2 = \frac{C*Va}{C+CL+s*Ron*CL*C}, |Vs2| \approx 0.0125Va \quad 4$$

From Equations 1, 2, 3 and 4 it may be seen that during the positive cycle the voltages Vd2 and Vs2 follow Va more than they do during the negative cycle, which is also seen in the simulation. This implies that overall the voltages on these nodes keep rising until the above described behavior continues in the positive and negative cycles. This behavior may also be seen in the waveforms of FIG. 3C. These waveforms also show that the DC component of the power amplifier output voltage also starts to move up to 0 V slowly as that is the only feasible DC solution at this point at both D1 and G1.

Figure 3F:
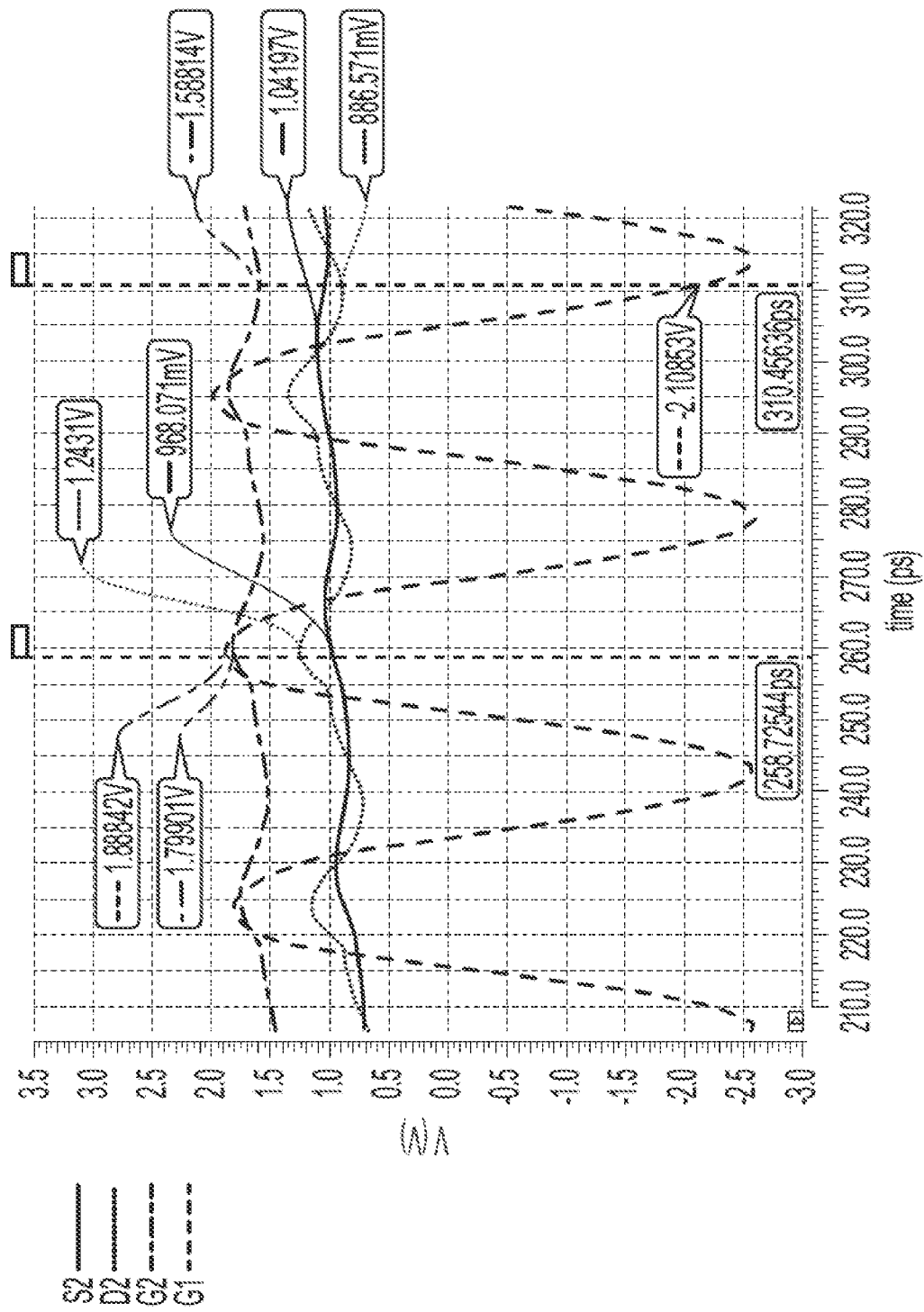
FIG. 3F is a graph of waveforms, according to an embodiment of the present disclosure.
Figure 3G:
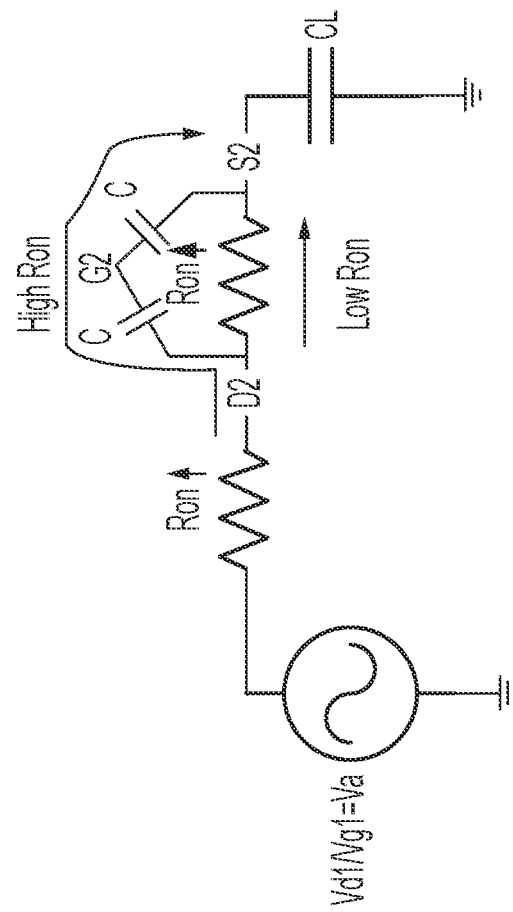
FIG. 3G is a diagram of a simplified equivalent circuit of a shunt switch, according to an embodiment of the present disclosure.

FIG. 3F shows simulated waveforms for a second phase, referred to herein as "phase 2". It may be seen from FIG. 3F that the gate-source voltages (Vgs) and the gate-drain voltages (Vgd) (especially the Vgs of the upper transistor M1) begin to decrease quite quickly. This implies a higher Ron, with every passing cycle, on the upper transistor M1.

The same trend may be seen occurring, more slowly, on the lower transistor M2, as S2 continues to increase while G2 does not increase with the same slope. This is due to the fact that with a high Vgs and low Ron, most of the current in a transistor in the on state shunts through the Ron rather than the Cgs and Cgd capacitors. Based on equation 1 and 2, the impact of the increasing Ron on the positive cycle is that the amplitude on both Vd2 and Vs2 begins to fall. While in the negative cycle, based on equation 3, the amplitude on Vd2 begins to increase, the amplitude of Vs2 still falls further, causing it to rise continuously in voltage over 1 time period (based on equation 4).

As briefly discussed above, as the Ron of the lower transistor M2 begins to increase (transitioning from the "Low Ron" equivalent circuit of FIG. 3G to the "High Ron" equivalent circuit of FIG. 3G), the current coming from (or going to) the upper transistor M1 starts dividing into Ron, the Cgs (which may be equal to C), and the Cgd (which may be equal to C) to finally reach CL. This means that the Vg2 voltage becomes a greater fraction of the signal swing. This is depicted in the phase 2 waveforms of FIG. 3F. As this begins to happen, Vs2, which remains flat in the negative cycle, continues to become more nearly equal to Vg2, until Vgs2 becomes zero, and the transistor only turns on due to Vgd2. It may be further seen from FIG. 3F that, along with increasing Ron, the duration of the positive cycle decreases in phase 2, while the duration of the negative cycle increases.

Figure 3H:
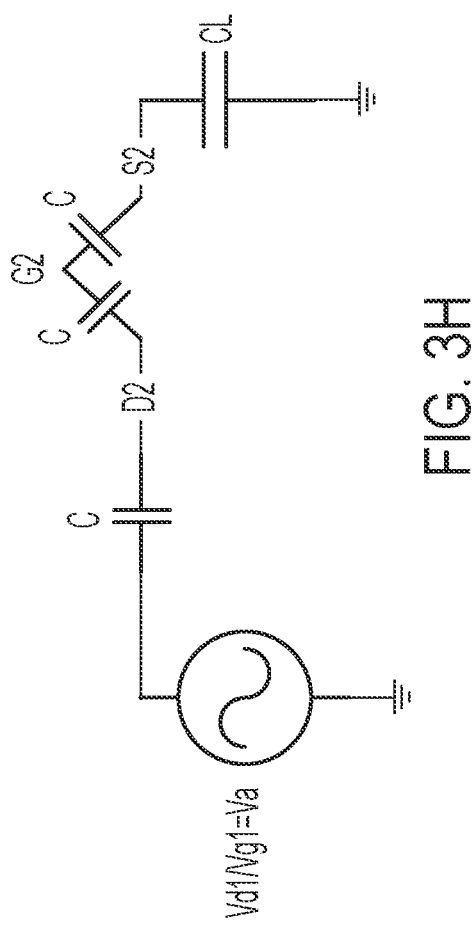
FIG. 3H is a diagram of a simplified equivalent circuit of a shunt switch, according to an embodiment of the present disclosure.
Figure 3I:
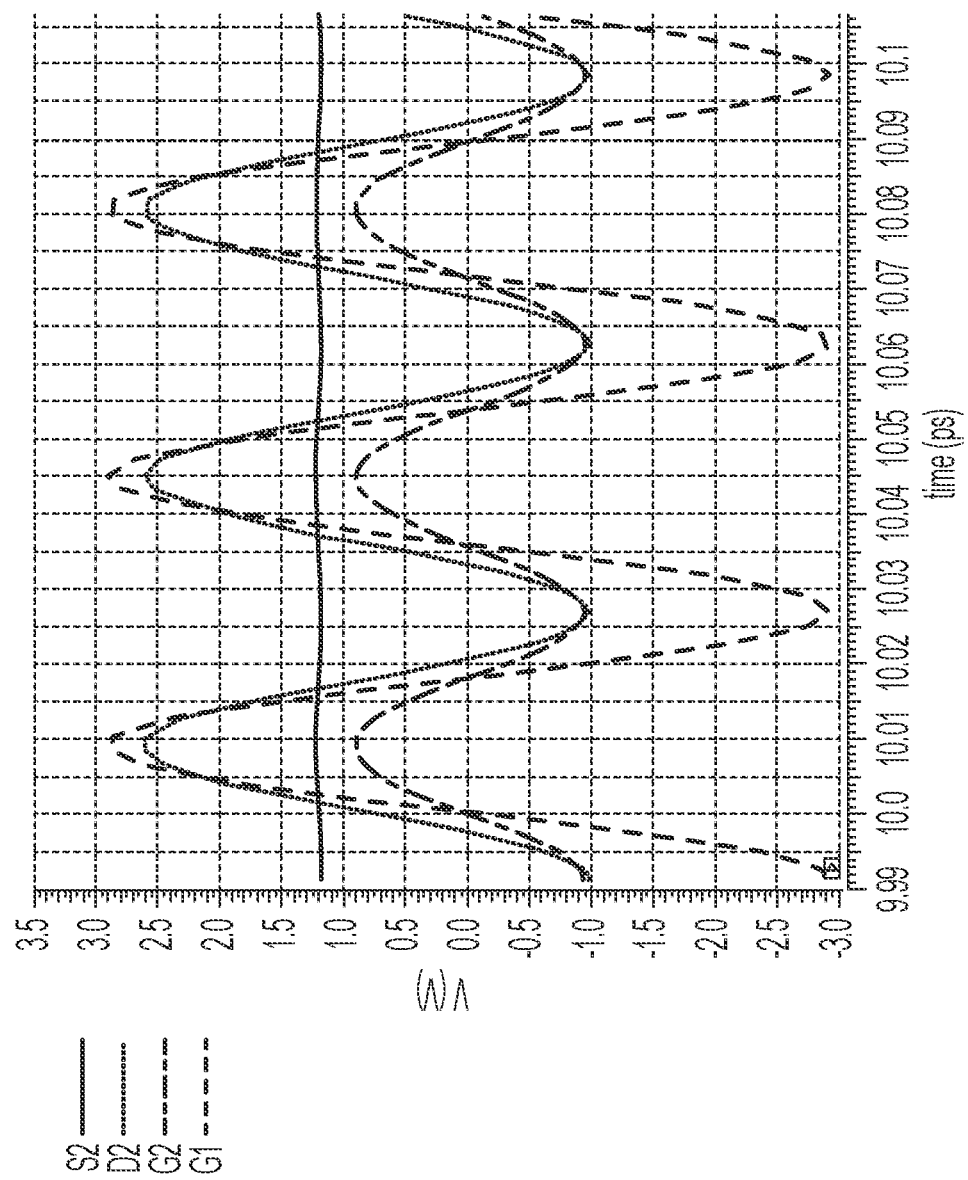
FIG. 3I is a graph of waveforms, according to an embodiment of the present disclosure.

As these changes in duration continue, the positive swings on Vd2 begin to decrease and the negative swings begin to increase. This results, eventually, in a reduction in the DC voltage at D2, and also at G2, which simply follows D2. These changes lead to steady state operation, referred to herein as "phase 3". A simplified equivalent circuit for the shunt switch in steady state is shown in FIG. 3H, and simulated waveforms are shown in FIG. 3I. In phase 3, the positive and the negative cycle swings are approximately the same and the DC on the nodes is substantially constant. This is possible only when in both positive and negative states the switch is in the same state, which in this case is the off state.

To summarize, the qualitative behavior of the switch in the transition to the off state is that the DC on G2 decreases and M2 starts to turn off and become a capacitor, while Ron of the upper transistor M1 keeps increasing. This continues until the upper transistor M1 no longer turns on and acts just like a capacitor, Coff.

The swings at each node at steady state may be calculated using the following equations, for both positive and negative cycles.

$$Vd2 = \frac{2*Va}{3} \quad 5$$

$$Vg2 = \frac{1*Va}{3} \quad 6$$

$$Vs2 \approx 0 \quad 7$$

The bootstrapping switch of the upper transistor M1 has two principal effects. It allows for a lower Coff for the structure by shorting the Cgd of the upper transistor, and it allows providing a DC voltage as desired by the power amplifier at its output while ensuring the switch does not turn on due to high Vgd swing during the negative cycle. The source node D2 of the upper transistor is self-biased as explained above.

The additional biasing of the nodes D2, S2, G1 and G2 by bias sources 210 (in addition to the self-biasing) may have the effect of shortening (by at least 30%, e.g., by about a factor of 2) the time the shunt switch takes to transition between the on state and the off state.

Figure 3J:
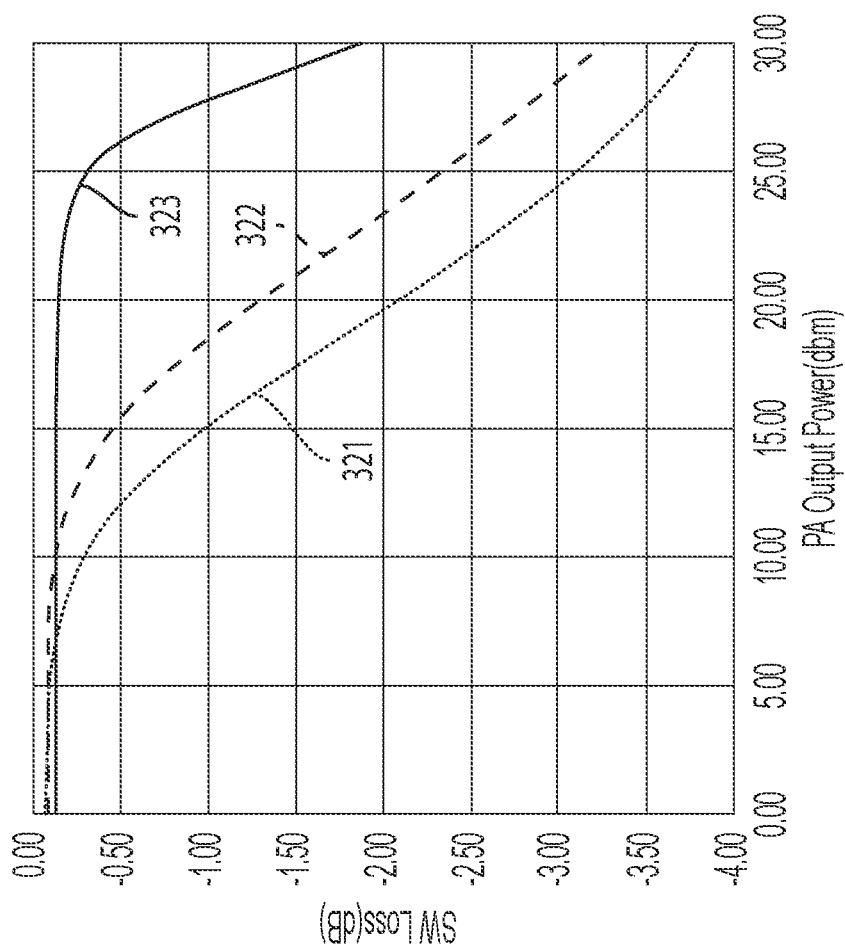
FIG. 3J is a graph of performance of a shunt switch, according to an embodiment of the present disclosure.
Figure 3K:
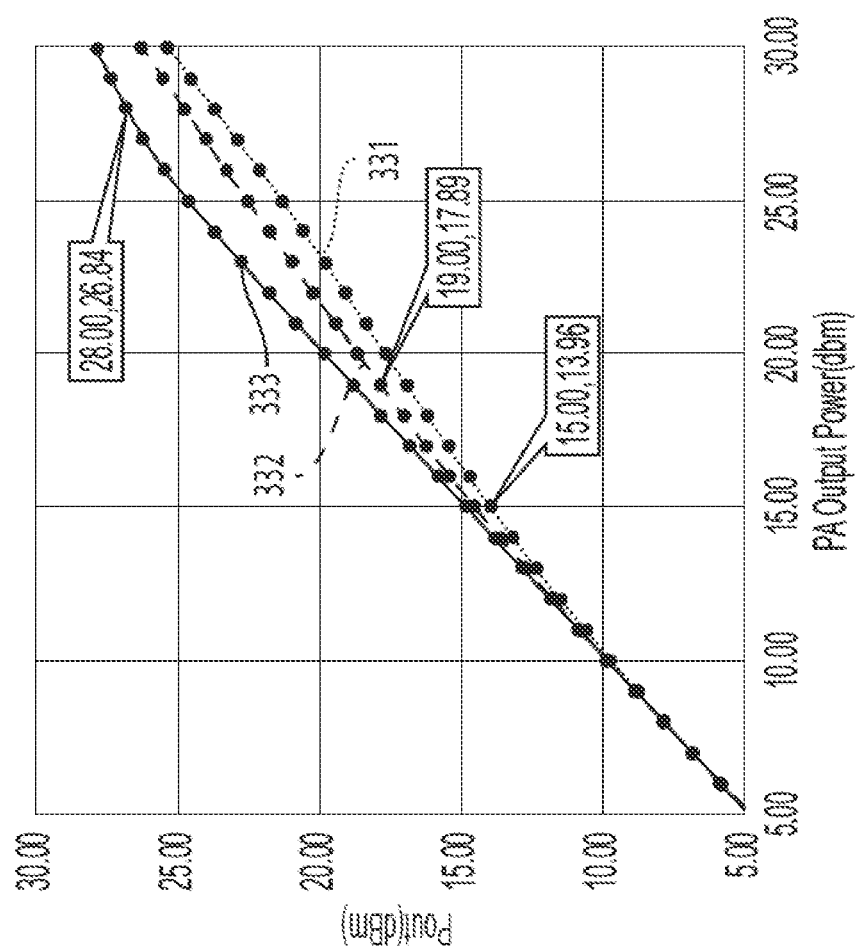
FIG. 3K is a graph of performance of a shunt switch, according to an embodiment of the present disclosure.

FIGS. 3J and 3K show off state loss due to the shunt switch (FIG. 3J) and the linearity of the shunt switch (FIG. 3K) as a function of power amplifier output power for (i) the circuit of FIG. 2A (curves 321 and 331), (ii) the circuit of FIG. 2B (curves 322 and 332), and (iii) the circuit of FIG. 3A (curves 323 and 333). FIG. 3K shows a higher linearity in the self-biasing switch configuration of FIG. 3A than in the circuits of FIGS. 2A and 2B. In some embodiments, the combination of (i) a power amplifier, (ii) a shunt switch according to FIG. 3A, and (iii) a quarter-wave transmission line may have the following performance characteristics: (i) loss=1.3 db (defined as the ratio of (1) the power produced by the power amplifier to (2) the power produced by the combination of the power amplifier, the shunt switch, and transmission line); (ii) loss due to Coff=0.436 db, calculated by providing an ideal short in place of Ron; loss due to Ron=1.154 db, calculated by providing an ideal open in place of Coff; loss due to the quarter-wave transmission line=0.15 db; max VDS swing across a transistor=2.2 V; and transient settling time to steady state (which may depend on signal level) less than 10 ns in some cases.

Figure 4A:
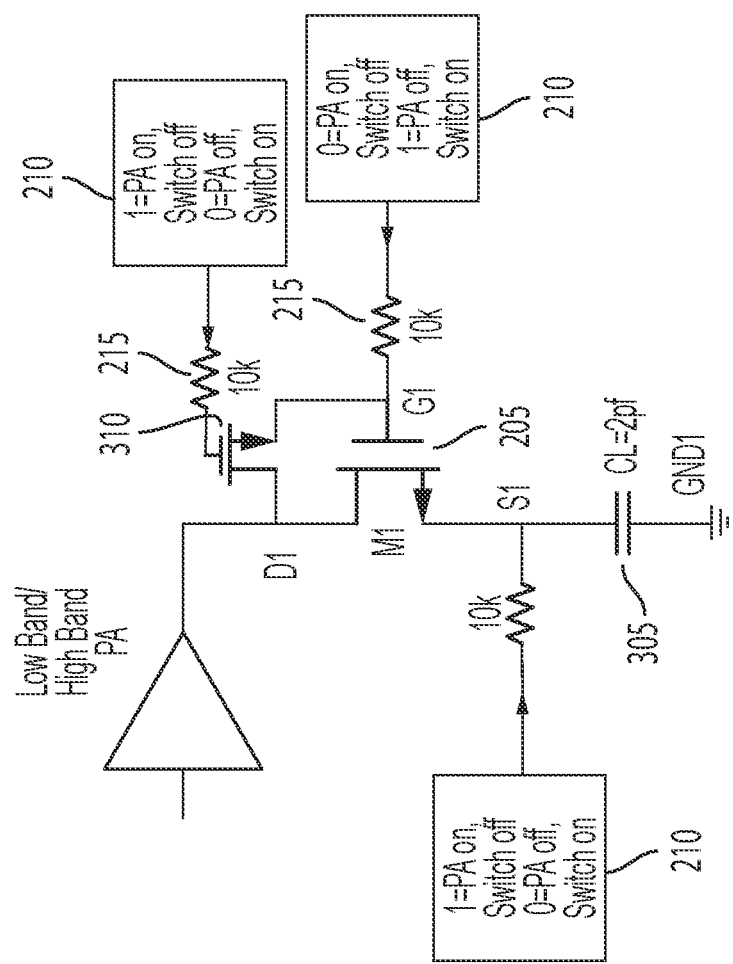
FIG. 4A is a schematic diagram of a shunt switch, according to an embodiment of the present disclosure.
Figure 4B:
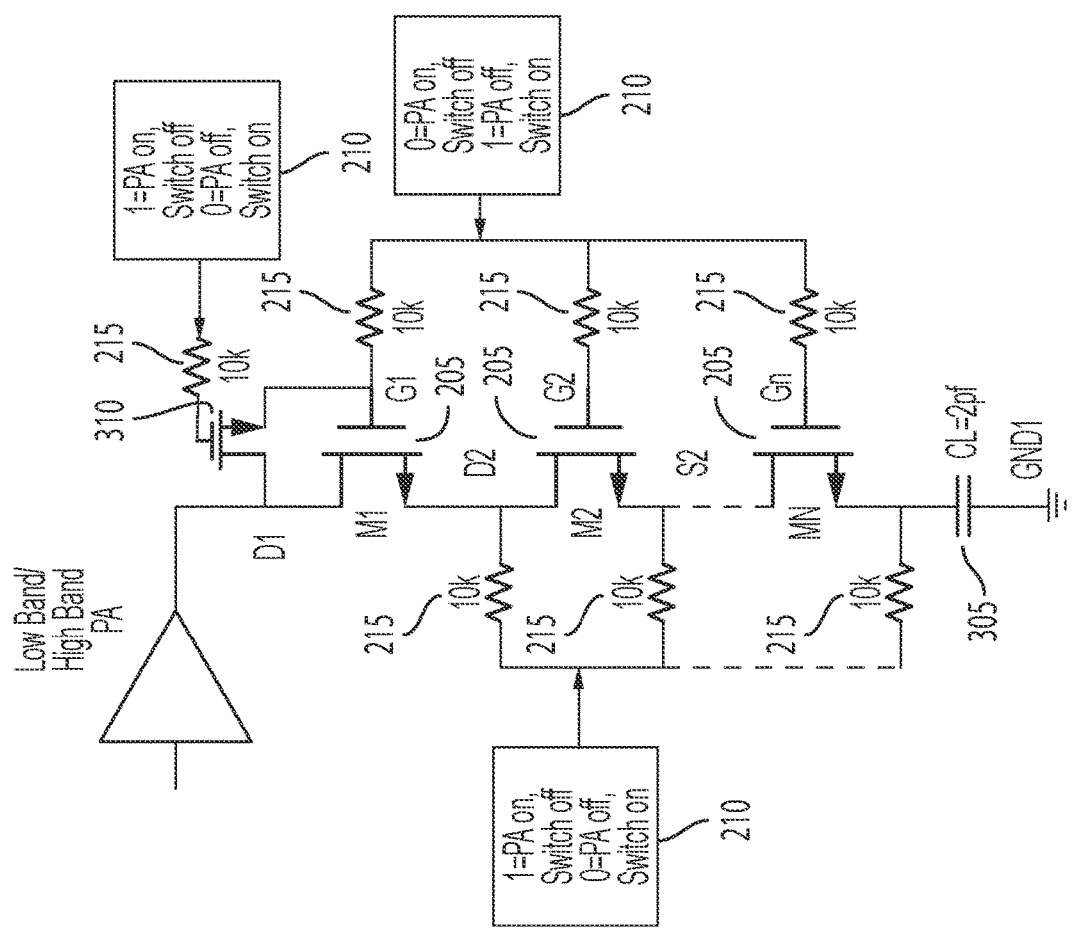
FIG. 4B is a schematic diagram of a shunt switch, according to an embodiment of the present disclosure.
Figure 4C:
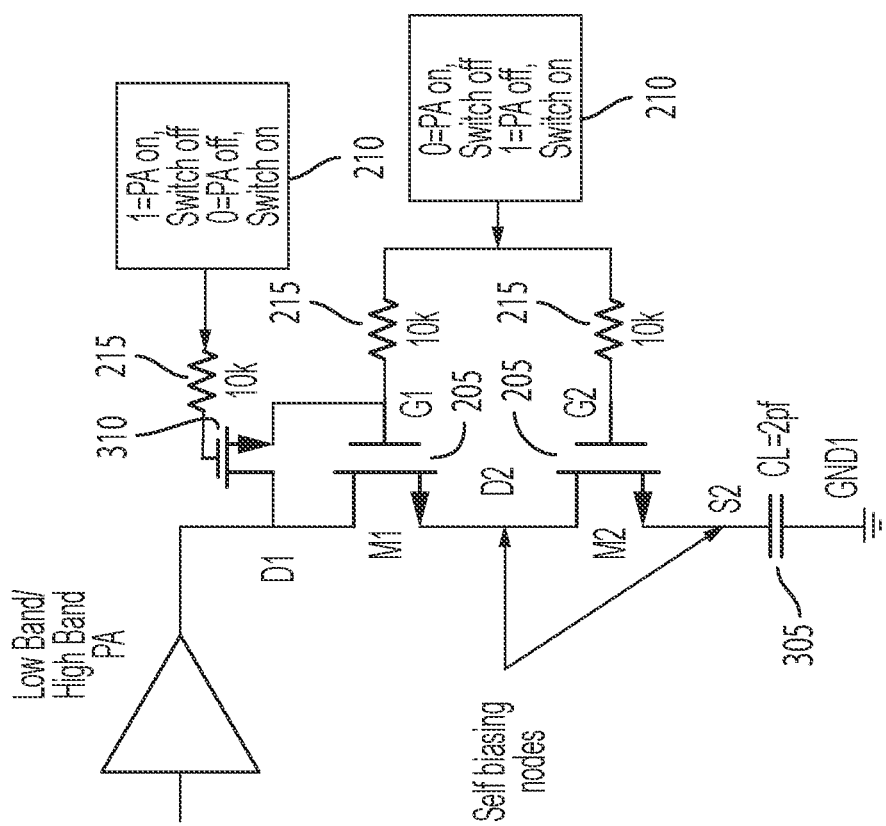
FIG. 4C is a schematic diagram of a shunt switch, according to an embodiment of the present disclosure.
Figure 4D:
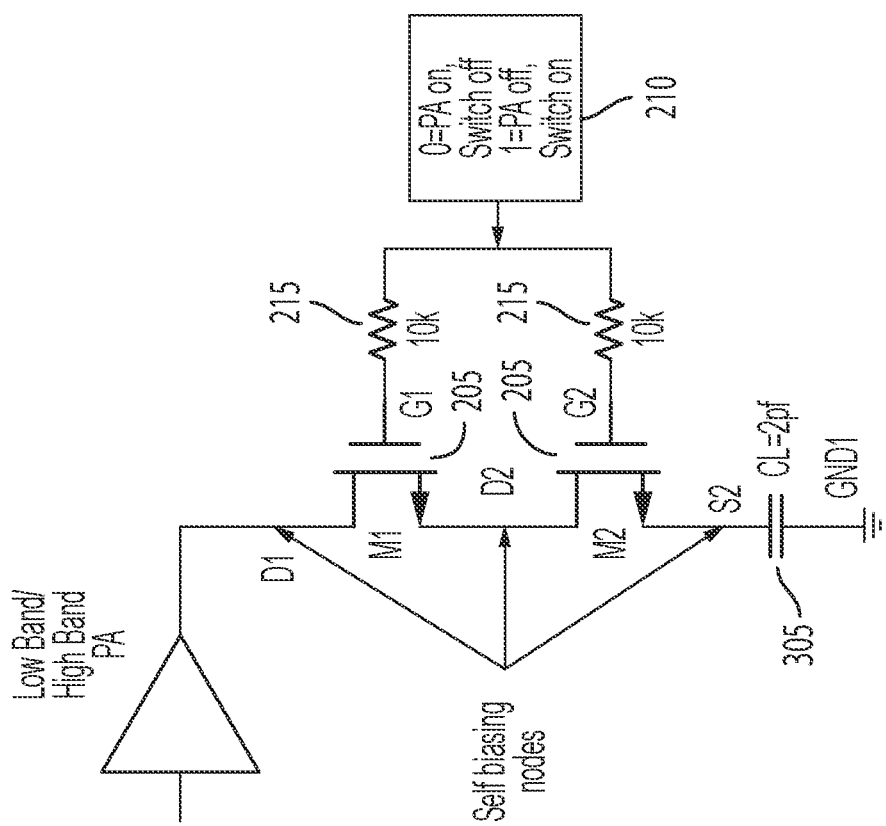
FIG. 4D is a schematic diagram of a shunt switch, according to an embodiment of the present disclosure.

In some embodiments the transistor stack includes fewer transistors than in the embodiment of FIG. 3A (i.e., one transistor, as shown in FIG. 4A) or more transistors than in the embodiment of FIG. 3A, e.g., an arbitrary number of transistors, as shown in FIG. 4B. In some embodiments, some of or all of the bias sources 210 and biasing resistors 215 may be absent, so that the nodes affecting the states of the transistors of the transistor stack are biased to a greater extent by the self-biasing of the shunt switch. FIGS. 4C and 4D show such embodiments, lacking the bias source 210 and biasing resistors 215 that in the embodiment of FIG. 3A provide bias to S2 and D2. The embodiment of FIG. 4D further differs from the embodiment of FIG. 3A in that the bootstrapping transistor 310 is absent.

The term "processing circuit" is used herein to mean any combination of hardware, firmware, and software, employed to process data or digital signals. Processing circuit hardware may include, for example, application specific integrated circuits (ASICs) or portions thereof, general purpose or special purpose central processing units (CPUs), digital signal processors (DSPs), graphics processing units (GPUs), and programmable logic devices such as field programmable gate arrays (FPGAs). In a processing circuit, as used herein, each function is performed either by hardware configured, i.e., hard-wired, to perform that function, or by more general-purpose hardware, such as a CPU, configured to execute instructions stored in a non-transitory storage medium. A processing circuit may be fabricated on a single printed circuit board (PCB) or distributed over several interconnected PCBs. A processing circuit may contain other processing circuits; for example, a processing circuit may include two processing circuits, an FPGA and a CPU, interconnected on a PCB.

As used herein, the term "or" should be interpreted as "and/or", such that, for example, "A or B" means any one of "A" or "B" or "A and B"

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the spirit and scope of the inventive concept.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "generally connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present. As used herein, "generally connected" means connected by an electrical path that may contain arbitrary intervening elements, including intervening elements the presence of which quantitatively changes the behavior of the circuit. As used herein, "connected" means (i) "directly connected" or (ii) connected with intervening elements, the intervening elements being ones (e.g., low-value resistors or inductors, short sections of transmission line) that do not qualitatively affect the behavior of the circuit.

Any numerical range recited herein is intended to include all sub-ranges of the same numerical precision subsumed within the recited range. For example, a range of "1.0 to 10.0" or "between 1.0 and 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a self-biasing shunt switch with bootstrapping have been specifically described and illustrated herein, many modifications and variations will be apparent to those skilled in the art. Accordingly, it is to be understood that a self-biasing shunt switch with bootstrapping constructed according to principles of this disclosure may be embodied other than as specifically described herein. The invention is also defined in the following claims, and equivalents thereof.

What is claimed is:

1. A shunt switch, comprising:
a transistor stack comprising a first transistor;
a capacitor; and
a bias circuit,
the transistor stack having a first end terminal and a second end terminal, a drain terminal of the first transistor being connected to the first end terminal, the first end terminal being connected to a switching terminal of the shunt switch,
the capacitor having a first terminal connected to the second end terminal of the transistor stack, and a second terminal connected to a low-impedance node, and
the bias circuit is connected to a source of the first transistor, and configured to self-bias the shunt switch to an off state based on a signal power received at the switching terminal.

2. The shunt switch of claim 1, further comprising a bootstrapping transistor connected across the first end terminal and a gate of the first transistor.

3. The shunt switch of claim 1, wherein the transistor stack further comprises a second transistor connected in series with the first transistor.

4. The shunt switch of claim 3, further comprising a bootstrapping transistor connected across the first end terminal and a gate of the first transistor.

5. The shunt switch of claim 1, wherein the bias circuit is further connected to a gate of the first transistor.

6. The shunt switch of claim 5, further comprising a bootstrapping transistor connected across the first end terminal and the gate of the first transistor.

7. The shunt switch of claim 6, wherein the bias circuit is further connected to a gate of the bootstrapping transistor.

8. The shunt switch of claim 1, wherein the transistor stack further comprises a second transistor,
wherein:
the first transistor is a field effect transistor of a first channel type,
the second transistor is a field effect transistor of the first channel type, and
the first transistor is connected in series with the second transistor.

9. The shunt switch of claim 8, wherein the bias circuit is further connected:
to a gate of the first transistor, and
to a gate of the second transistor.

10. The shunt switch of claim 9, wherein the bias circuit comprises a first bias source connected:
through a first resistor to the gate of the first transistor, and
through a second resistor to the gate of the second transistor.

11. The shunt switch of claim 10, wherein the bias circuit is further connected to a source of the second transistor.

12. The shunt switch of claim 11, wherein the bias circuit further comprises a second bias source connected:
through a third resistor to the source of the first transistor; and
through a fourth resistor to the source of the second transistor.

13. The shunt switch of claim 8, further comprising a bootstrapping transistor connected across the first end terminal and a gate of the first transistor.

14. The shunt switch of claim 13, wherein:
the first transistor is an n-channel field effect transistor,
the second transistor is an n-channel field effect transistor, and
the bootstrapping transistor is an n-channel field effect transistor.

15. The shunt switch of claim 14, wherein the bias circuit further comprises:
a first bias source connected:
through a first resistor to the gate of the first transistor, and
through a second resistor to a gate of the second transistor;
a second bias source connected:
through a third resistor to a source of the first transistor, and
through a fourth resistor to a source of the second transistor; and
a third bias source connected through a fifth resistor to a gate of the bootstrapping transistor.

16. The shunt switch of claim 15, wherein:
in an on state of the shunt switch:
the first bias source supplies a first voltage,
the second bias source supplies a second voltage, and
the third bias source supplies the second voltage; and
in an off state of the shunt switch:
the first bias source supplies the second voltage,
the second bias source supplies the first voltage, and
the third bias source supplies the first voltage;
the second voltage being greater than the first voltage.

17. A transmitter, comprising:
a first power amplifier having an output connected to a common node through a first transmission line; and
a first shunt switch, the first shunt switch being the shunt switch according to claim 1.

18. The transmitter of claim 17, further comprising:
a second power amplifier having an output connected to the common node through a second transmission line; and
a second shunt switch, having a switching terminal connected to the output of the second power amplifier.

19. A shunt switch having a switched terminal, the shunt switch comprising:
a transistor stack comprising a first transistor, the transistor stack having a first end terminal and a second end terminal, the first end terminal being connected to the switched terminal, and the second end terminal being connected to a low-impedance node; and
a bias circuit connected to a source of the first transistor, the shunt switch being configured to self-bias:
to an on state, when a signal power at the switched terminal is less than a first threshold, and
to an off state, when the signal power at the switched terminal is greater than a second threshold,
the second threshold being greater than the first threshold.

20. The shunt switch of claim 19, further comprising a capacitor having a first terminal connected to the second end terminal of the transistor stack, and a second terminal connected to a low-impedance node,
wherein the transistor stack further comprises a second transistor connected in series with the first transistor, and
wherein the bias circuit is further connected to a gate of the first transistor.

* * * * *